United States Patent [19]

Kotecha

[11] 4,334,292

[45] Jun. 8, 1982

[54] LOW VOLTAGE ELECTRICALLY ERASABLE PROGRAMMABLE READ ONLY MEMORY

[75] Inventor: Harish N. Kotecha, Essex Junction, Vt.

[73] Assignee: International Business Machines Corp., Armonk, N.Y.

[21] Appl. No.: 153,359

[22] Filed: May 27, 1980

[51] Int. Cl.³ .............................................. G11C 11/40
[52] U.S. Cl. ................................... 365/182; 365/189; 357/23
[58] Field of Search ................. 365/182, 189; 357/23, 357/41, 54

[56] References Cited

U.S. PATENT DOCUMENTS

| | | |
|---|---|---|
| 3,825,946 | 7/1974 | Frohman-Bentchkowsky ... 365/189 |
| 4,161,039 | 7/1979 | Rössler ............................... 365/185 |

OTHER PUBLICATIONS

IBM Technical Disclosure Bulletin, Floating Gate Nonvolatile Memory Cell, vol. 22, No. 6, Nov. 1979, pp. 2403-2404.

Primary Examiner—Terrell W. Fears
Attorney, Agent, or Firm—Stephen J. Limanek

[57] ABSTRACT

An improved memory system is provided for charging and discharging a conductive plate such as a floating gate of a field effect transistor with a charge injector controlled by a low single polarity voltage pulse. In the system of the invention, the conductive plate may be a floating gate of a field effect transistor which also includes first and second or dual control gates. A single or double graded band gap layer, such as a silicon rich layer of silicon dioxide is disposed only between the floating gate and the first control gate forming a capacitor having a given capacitance with a larger capacitor disposed between the second control gate and the floating gate. These cells or transistors may be used in an array for storing for long periods of time, on the order of 10 years or more, binary digits of information representing a 0 or a 1 depending upon whether a charge is stored on the floating gate. When using these cells in a memory array, information may be written into or erased from each of the cells individually or a blanket erase may be employed for the entire or a selected section of the array. To write and to erase a cell, a low single polarity voltage is employed. Several embodiments of the invention are disclosed including one embodiment wherein the dual gates are located on one side of the floating gate, a second embodiment which uses a diffusion in a semiconductor substrate as one of the control gates and a third embodiment wherein one of the control gates is disposed on one side of, or above, the floating gate and the other control gate is disposed on the other side of, or below, the floating gate near the surface of the channel region of the transistor.

27 Claims, 6 Drawing Figures

LOW VOLTAGE ELECTRICALLY ERASABLE PROGRAMMABLE READ ONLY MEMORY

DESCRIPTION

TECHNICAL FIELD

This invention relates to integrated semiconductor circuits and more particularly to a storage system or transistor array which may be used, e.g., in electrically erasable programmable read only memories (EEPROM) or in non-volatile random access memories.

BACKGROUND ART

Integrated semiconductor circuits, particularly systems or arrays having transistors each of which represents a binary digit of information, as in read only memories (ROM), have achieved high device or cell densities.

In, e.g., U.S. Pat. No. 3,914,855, filed May 9, 1974 there is described a read only memory wherein the array has transistors made with a thin gate dielectric exhibiting a low threshold voltage for storing a 1 digit of binary information and transistors made of a thick gate dielectric exhibiting a considerably higher threshold voltage for storing the other digit of binary information. This patent also describes a read only memory wherein the array is encoded by etching apertures in the gate electrodes of selected devices and implanting ion impurities through the apertures to render the selected devices inoperative, as defining a 1 digit of binary information, while the remaining devices which do not have apertures in the gate electrode are operative devices or transistors defining the other digit of binary information.

A read only memory disclosed in U.S. Pat. No. 4,096,522, filed Aug. 8, 1977 is personalized by completing connections between selected source and drain electrodes and the channel regions of the transistors.

In U.S. Pat. No. 4,161,039, filed Feb. 6, 1978, there is disclosed a memory array utilizing field effect transistors (FET) where information is stored in floating gates and the channel region is made short by employing double-diffusion processing techniques, as disclosed in more detail in "Electronics", Feb. 15, 1971, at pages 99–104. This memory is not a simple read only memory but one that can be reprogrammed by erasing the stored information with ultraviolet light.

Commonly assigned U.S. Pat. No. 3,972,059, filed Dec. 28, 1973 by T. H. DiStefano discloses a charge store FET memory suitable for operation in a read only mode which includes a floating gate and a write gate separated by a first insulating layer having a low band gap at the write gate and an erase gate separated from the floating gate by a second insulating layer having a low band gap at the floating gate.

Commonly assigned U.S. Pat. No. 4,104,675, filed June 21, 1977 by D. J. DiMaria et al discloses a non-destructive long-term storage system using a single graded energy band gap structure in each cell which may be driven by a low voltage.

In IBM Technical Disclosure Bulletin Vol. 22 No. 6 November 1979 pp. 2403–2404 there is described another floating gate non-volatile memory cell having a split control gate.

In commonly assigned U.S. patent application Ser. No. 124,003 filed Feb. 25, 1980 by D. J. DiMaria there is disclosed a non-destructive long-term storage system using a dual charge injector or dual graded energy band gap structure in each cell which is driven by a low voltage.

In U.S. Pat. No. 3,825,946, filed Oct. 19, 1973 there is disclosed an electrically alterable floating gate storage or memory device having two control gates, one being used for writing and the other being used for erasing. A common positive voltage is alterably applied to the two control gates for writing and erasing.

DISCLOSURE OF THE INVENTION

It is an object of this invention to provide an improved field effect transistor (FET) or metal-insulator-semiconductor (MIS) device which stores in a non-volatile mode binary information that is electrically written or erased, with applications in both memory and logic circuits.

It is another object of this invention to provide an improved electrically erasable programmable read only memory or non-volatile random access memory wherein data can be written or erased selectively, the writing and erase operations are performed independently of the field effect transistor action in each cell and write and erase operations can be performed a large number of times.

It is still another object of this invention to provide an improved electrically erasable read only memory having cells wherein charge leakage is minimized and charge retention time is maximized.

It is a further object of this invention to provide an improved electrically erasable read only memory having cells with a floating gate or charge trapping layer wherein substantially all charges produced by a charge injector driven by a low voltage are trapped on the floating gate or layer.

It is still a further object of this invention to provide an improved electrically erasable read only memory wherein charge is trapped on the floating gate of the cell and erased therefrom by a low voltage injector.

Yet another object of the invention is to provide an improved electrically erasable read only memory wherein charge is trapped on the floating gate of the cell and erased therefrom by a low voltage injector employing a single polarity pulse.

It is yet a further object of this invention to provide a system for charging and discharging a conductive plate with a charge injector controlled by a low single polarity voltage pulse.

In accordance with the teachings of this invention, an improved system is provided for charging and discharging a conductive plate with a charge injector controlled by a low single polarity voltage pulse. In a preferred embodiment of the invention, the conductive plate is a floating gate of a field effect transistor which also includes first and second or dual control gates. A single or double graded band gap layer, such as a silicon rich layer of silicon dioxide is disposed only between the floating gate and the first control gate forming a capacitor having a given capacitance with a larger capacitor disposed between the second control gate and the floating gate. These cells or transistors may be used in an array for storing for long periods of time, on the order of 10 years or more, binary digits of information representing a 0 or a 1 depending upon whether a charge is stored on the floating gate. When using these cells in a memory array, information may be written into or erased from each of the cells individually or a blanket erase may be employed for the entire or a selected section of the array. To write and to erase a cell, a low single polarity voltage is employed. Several embodiments of the invention are disclosed including one embodiment wherein the dual gates are located on one side of the floating gate, a second embodiment which uses a diffusion in a semiconductor substrate as one of the control gates and a third embodiment wherein one of the control gates is disposed on one side of, or above, the floating gate and the other control gate is disposed on the other side of, or below, the floating gate near the surface of the channel region of the transistor.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
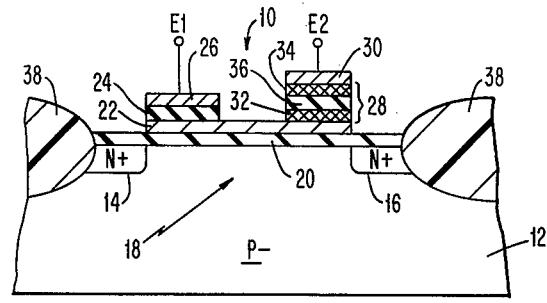
FIG. 1 is a sectional view illustrating an embodiment of a memory cell of the present invention having two control gates on one side of the floating gate of a field effect transistor.

Referring to FIG. 1 of the drawings in more detail, there is shown an embodiment of a cell of the invention forming a field effect transistor 10 in a semiconductor substrate 12. The transistor includes source and drain regions 14 and 16 defining a channel region 18 therebetween disposed at the surface of the substrate 12. A thin dielectric layer 20 which may be made of silicon dioxide is formed on the surface of substrate 12 and a conductive plate acting as a floating gate 22 is disposed on dielectric layer 20. On the floating gate 22 another thin dielectric layer 24, e.g., silicon dioxide, separates a first control gate 26, connected to a terminal E1, from the floating gate 22 forming a capacitor having a large capacitance. Also disposed on the floating gate 22 is a dual charge or electron injector system 28 of the type disclosed in the above identified U.S. patent application filed by D. J. DiMaria. The charge injector system 28 separates a second control gate 30, connected to a terminal E2, from the floating gate 22 and forms a capacitor with the floating gate 22 and the second control gate 30 having a capacitance substantially smaller than that of the capacitor formed by the floating gate 22, dielectric layer 24 and the first control gate 26. The dual charge injector system 28 includes preferably first and second silicon rich layers of silicon dioxide 32 and 34, respectively, between which is disposed a dielectric layer 36, made preferably of silicon dioxide, as described more fully in the above identified DiMaria patent application. The transistor 10 is isolated from other circuits which may be formed in substrate 12 by recessed or thick oxide identified by reference numeral 38.

In the operation of the cell of FIG. 1 of the drawings, a negative charge is stored on the floating gate 22 to represent a 1 digit of binary information and the floating gate without charge or in an erase condition represents a 0 digit of binary information. To store a negative charge or electrons on the floating gate 22, a voltage $+V$ is applied to terminal E1 with terminal E2 grounded. Charge in the form of electrons is injected onto the floating gate 22 from the injector system 28, more specifically from silicon rich silicon dioxide layer 34. With the voltage $+V$ having a value between say $+10$ volts and $+20$ volts, the charge will not tunnel into dielectric layer 24 toward the first control gate 26. Accordingly, all of the charge will remain on the floating gate 22. Furthermore, since the capacitance of the capacitor formed by the first electrode 26, dielectric layer 24 and the floating gate 22 is large compared with the capacitance of the dual injector system 28, most of the positive voltage applied to terminal E1 is developed across the dual injector system 28 to drive a large quantity of charge rapidly onto the floating gate 22. In order to remove the charge from the floating gate 22, a voltage $+V$ is applied to the terminal E2 with terminal E1 grounded. Again most of the positive voltage applied to terminal E2 is developed across the dual injector system 28 and because of the reversal in voltage polarity across injector 28, the charge on the floating gate 22 is now attracted into the dual injector system 28 to erase the charge previously stored therein.

It can be seen that with the charge, i.e., electrons, trapped on the floating gate 22, transistor 10 has a high threshold voltage and with no electrons trapped on the floating gate 22, transistor 10 has a substantially lower threshold voltage. Thus, by applying an appropriate voltage to terminal E1 current may be made to pass through the channel region 18 between the source and drain regions 14 and 16 when electrons are not trapped on the floating gate 22, representing one digit of binary information, whereas with this same appropriate voltage applied to terminal E1 current will not pass through channel region 18 when electrons are trapped on the floating gate, representing the other digit of binary information. It should be noted that by using the charge injector 28, only a low voltage, e.g., about 10 volts, need be used to store charge on a conductive plate or floating gate and that by using two control electrodes with a dual injector disposed between only one of the control electrodes and the floating gate, the same low voltage of one polarity can be used for both charging and erasing the floating gate. This cell operates rapidly to both charge and discharge the floating gate since with approximately 10 volts applied across the dual injector a switching action occurs within the dual injector readily injecting charge, within hundreds of nanoseconds, to or from the floating gate depending upon the voltage polarity across the dual injector, and the information in the cell is read in a substantially shorter time.

It should also be noted that if only a blanket erase is required in an array of these cells, a single injector may be disposed between the second control gate or electrode 30 and the floating gate 22. This single injector would include only the silicon rich silicon dioxide or graded band gap layer 34 and the silicon dioxide layer 36. The writing or charging of the floating gate 22 would be performed as described hereinabove, but the blanket erase could be performed by the known use of ultraviolet radiation on the cells.

The cell or transistor 10 may be made by any known process, such as by the following steps. The recessed oxide 38 is first grown in the substrate 12 and the thin dielectric layer 20 acting as the gate oxide is formed on the substrate 12. A first layer of doped polysilicon is deposited on the dielectric layer 20. The dual electron injector system 28 is then provided as described in more detail in the above referenced DiMaria patent application by depositing layers of silicon rich silicon dioxide, silicon dioxide and silicon rich silicon dioxide over the layer of polysilicon. A silicon nitride layer then covers the entire structure. These layers are etched to the surface of dielectric layer 20 defining the polysilicon floating gate 22. The edges of the polysilicon floating gate 22 are oxidized and the remaining silicon nitride over the floating gate is etched away. A second layer of polysilicon is then deposited and etched along with the layers of the injector system to define the second control gate 30 and the injector system 28 between the second control gate 30 and the floating gate 22. Over the exposed surface of the floating gate 22 a layer of silicon dioxide, e.g., 200 to 500 angstroms thick, is formed preferably by using chemical vapor deposition techniques to provide the thin dielectric layer 24. A third layer of polysilicon, or, if desired, a refractory metal, is deposited and etched to form the first control gate 26. The source and drain regions 14, 16 may be made by known ion implantation techniques. To complete the structure, known reoxidation-drive in, passivation, contact and metalization processes may be used. Other process steps that may be used to make the structure of this invention are disclosed in the above referenced DiMaria et al patent. It should be understood that other dielectric materials, such as silicon nitride, may be substituted for the silicon dioxide in layer 24 and in dual injector system 28.

Figure 2:
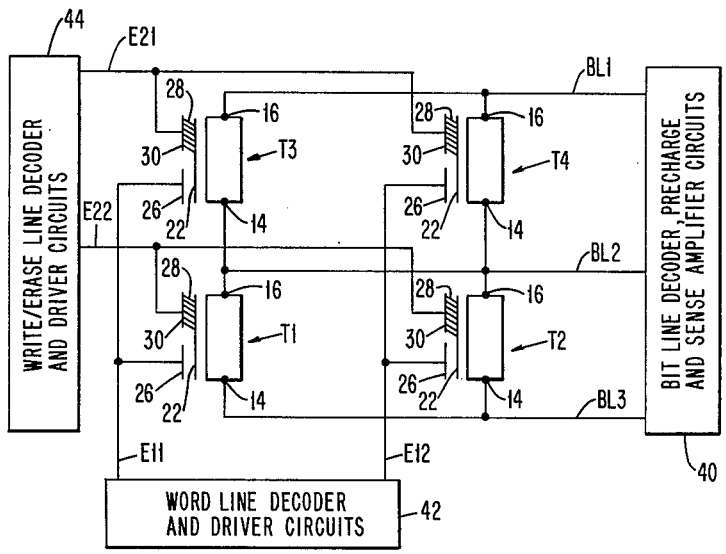
FIG. 2 illustrates a memory system of the present invention having an array of cells each of which may be of the type illustrated in FIG. 1 of the drawings.

In FIG. 2 of the drawing there is illustrated a memory system having an array of cells each of which may be of the type shown in FIG. 1 of the drawings. The array is shown as having four cells or transistors T1, T2, T3 and T4, each of which is similar to transistor 10 illustrated in FIG. 1 of the drawings, with similar elements being identified by the same reference numerals. Cells T1 and T2 are arranged in a row and have their source/drain regions 14, 16 connected to bit lines BL2 BL3 and cells T3 and T4 are arranged in a row with their source/drain regions 14, 16 connected to the bit lines BL1 and BL2. Bit lines BL1, BL2 and BL3 are connected to bit line decoder, precharge and sense amplifier circuits 40. Cells T1 and T3 are arranged in a column and have their first control electrode 26 connected to a word line E11 and the cells T2 and T4 also arranged in a column have their first control electrode 26 connected a word line E12. The word lines E11 and E12 are connected to word line decoder and driver circuits 42. The second control gates of cells T3 and T4 are connected to a conductive line E21 and the second control gates of cells T1 and T2 are connected to a conductive line E22. Conductive lines E21 and E22 are connected to write/erase line decoder and driver circuits 44.

Figure 3:
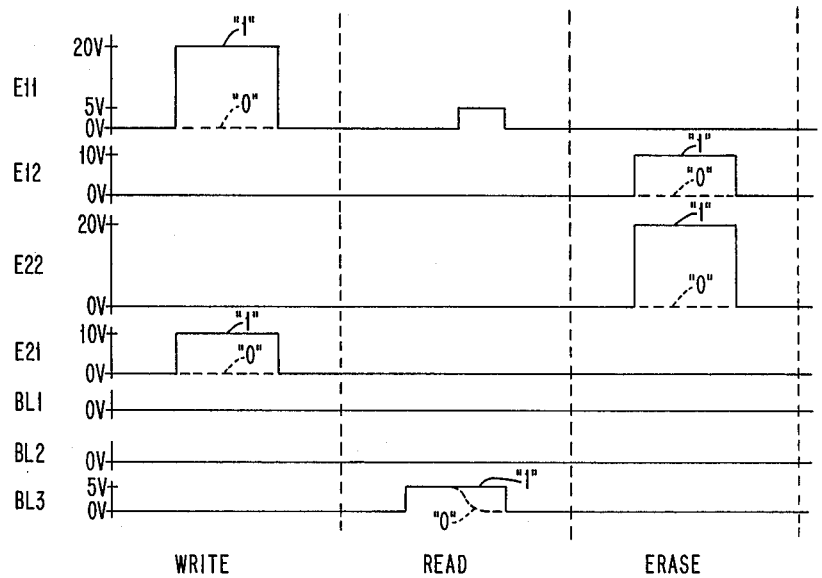
FIG. 3 is a pulse program which may be used to operate the system illustrated in FIG. 2 of the drawings.

To better understand the operation of the memory system illustrated in FIG. 2 of the drawing reference may be had to the pulse program indicated in FIG. 3.

To write a 1 binary digit of information into cell T1, as indicated in FIG. 3 of the drawing, a voltage of 20 volts is applied to word line E11, with word line E12 and all of the bit lines BL1, BL2 and BL3 grounded and a voltage of 10 volts applied to the conductive line E21. With this arrangement it can be seen that 20 volts are applied to the first control gate 26 of cell T1 while the second control gate 30 of cell T1 is grounded, causing charge to be injected through the injector system 28 onto floating gate 22. It should be noted that although 20 volts are also applied to the first control gate of cell T3, electrons will not be injected into floating gate 22 of the cell T3 since a voltage of 10 volts is applied to the second control electrode 30 making a differential voltage between the first and second control gates 26 and 30, respectively, equal to only 10 volts. If a 0 digit of binary information were to be written into cell T1, word line E11 as well as conductive line E21 would be at ground along with bit lines BL1, BL2 and BL3, conductive line E22 and word line E12.

To read the 1 digit of binary information stored in cell T1, bit line BL3 is precharged to +5 volts and then a voltage of 5 volts is applied to word line E11. Since the floating gate is charged with electrons producing a high threshold voltage in cell or transistor T1, the 5 volts applied to the first control gate 26 will not permit conduction through the channel region 18 between the source/drain regions 14, 16 of transistor T1 and, therefore, the voltage on bit line BL3 will remain at approximately 5 volts. If a 0 digit of binary information had been stored in cell T1, the 5 volts applied to the first control gate 26 of cell T1 would permit conduction through the channel region 18 between the source/drain region 14, 16 of cell T1 and, therefore, the precharged bit line BL3 would be discharged to ground as indicated in FIG. 3 of the drawings. It should be noted that by precharging bit line BL1 at the same time that bit line BL3 is precharged both cells T3 and T1 may be read out simultaneously.

To erase or discharge the electrons stored in the floating gate 22 of cell T1 representing a 1 digit of binary information, a voltage of 20 volts is applied to conductive line E22 with the word line E11 grounded, while the word line E12 is at 10 volts and the bit lines BL1, BL2 and BL3 and conductive line E21 are grounded. It can be readily seen that with 20 volts on the second control gate 30 with the first control gate 26 grounded, charge on the floating gate 22 of cell T1 will be attracted into the dual injector system 28 neutralizing the charge on floating gate 22. It can also be seen that even though 20 volts is applied to the second control gate 30 of cell T2, cell T2 will not be erased since a voltage of 10 volts is applied to the first control gate of cell T2 producing only a voltage differential of 10 volts between the second control gate 30 and the first control gate 26 of cell T2. Of course, if a 0 digit of binary information had been stored in cell T1, the voltage on conductive line E22 and word line E12 could have been at ground along the other grounded lines. Of course, if all cells are to be erased simultaneously in a blanket erase, then both conductive lines E21 and E22 would be at 20 volts, with all other lines grounded. It should be noted that if a single injector is to be used between the second control gate 30 and the floating gate 22 erasing may be performed by the use of ultraviolet light. It should also be noted that the word line decoder and driver circuits 42 are used for writing, erasing and reading and that the write/erase line decoder and driver circuits 44 are used only for writing and erasing. Furthermore, it should be noted that the cycle for writing, reading and erasing cells T2, T3 and T4 is similar to that disclosed hereinabove in connection with the operation of cell T1.

Figure 4:
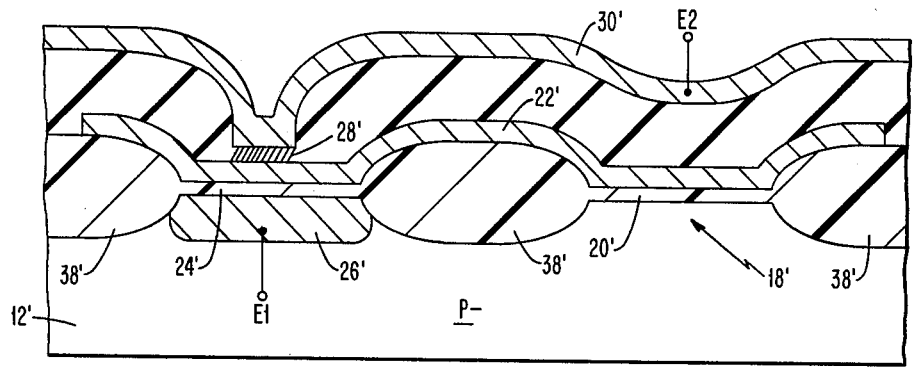
FIG. 4 is a sectional view of a second embodiment of a cell of the present invention wherein one of the two control gates of the field effect transistor is made in the form of a diffusion within a semiconductor substrate.
Figure 5:
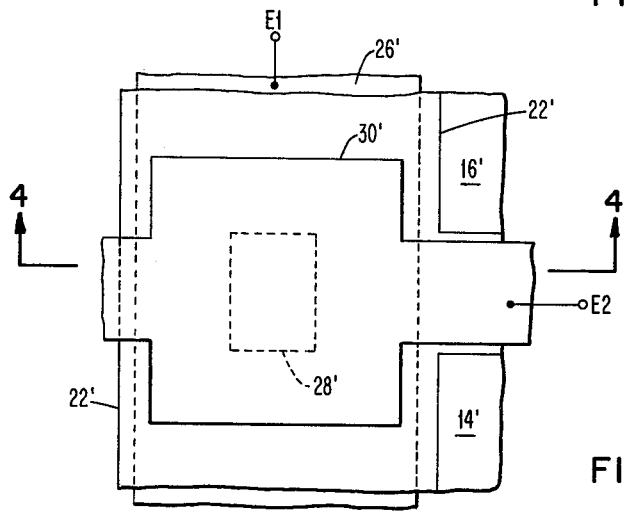
FIG. 5 is a plan view of the second embodiment of the present invention illustrated in FIG. 4 of the drawing with the sectional view of FIG. 4 taken through line 4—4 in FIG. 5.

FIGS. 4 and 5 of the drawings illustrate a second embodiment of a cell of the present invention, with FIG. 4 being a sectional view and FIG. 5 being a plan view through which the sectional view of FIG. 4 is taken at lines 4—4. Elements of the cell illustrated in FIGS. 4 and 5 which are similar to the elements of the cell illustrated in FIG. 1 are indicated by the same reference numerals to which a prime designation has been added. It should be noted that the main differences between the cell of FIGS. 4 and 5 and that of FIG. 1 are that the first control electrode is made in the form of a diffusion region 26' at the surface of the semiconductor substrate 12' and the source and drain regions 14' and 16' define a channel 18' which is controlled by an extension of the floating gate 22'. The dual charge injector system 28' remains between the second control electrode 30' and the floating gate 22'. The operation of the cell illustrated in FIGS. 4 and 5 is similar to the operation described hereinabove in connection with the cell illustrated in FIG. 1 of the drawings.

Figure 6:
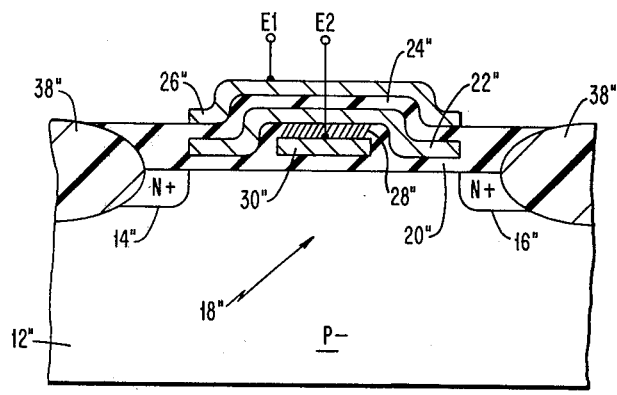
FIG. 6 is a sectional view of a third embodiment of a cell of the present invention wherein the floating gate of the transistor has a different one of two control gates disposed on opposite sides thereof.

A third embodiment of a cell of the present invention is illustrated in FIG. 6 in sectional view. In this cell elements similar to the elements of the cell of FIG. 1 are identified by the same reference numerals with a double prime added thereto. As can be seen, the second control gate 30" is disposed between the surface of substrate 12" and the floating gate 22" with the dual electron injector system 28" disposed between the second control gate 30" and the floating gate 22". The first control gate 26" is disposed over the floating gate 22" with a dielectric medium 24" forming a capacitor having a large capacitance. The cell illustrated in FIG. 6 of the drawings operates in a manner similar to the operation of the cell shown in FIG. 1 except that E2 acts as a terminal connected to one of the word lines E11 or E12 and E1 is a terminal connected to one of the two conductive lines, such as E21 or E22, when used in the array illustrated in FIG. 2 of the drawings. Furthermore, when using the cells of FIG. 6 in the array of FIG. 2, the lines E21 and E22 of FIG. 6 are arranged orthogonal to the bit lines BL1, BL2 and BL3. It should be noted that in the arrangement shown in FIG. 6 of the drawing, the transistor acts effectively as two serially arranged transistors since current will not flow between the source and drain regions 14", 16" unless there is a pulse applied to terminal E2. Although the dual charge injector system 28" is illustrated in FIG. 6 as being located between the second control gate 30" and the floating gate 22", if desired, the injector system 28" may be disposed between first control gate 26" and the floating gate 22". Also, it should be understood that the control gates 26", 30" and the injector system 28" need not be symmetrically arranged with respect to the source and drain regions 14", 16", but may be disposed to one side, such as over the channel region 18" near the N+ region 16". This embodiment of the invention may be used advantageously when there is a concern about over erasing the floating gate, which could occur under certain situations.

It can be seen that the cell of the present invention may be used as a non-volatile semiconductor random access memory or as a fast operating electrically erasable programmable read only memory since it is capable of being written, read or erased within hundreds of nanoseconds, making this cell very versatile and useful in many applications. Furthermore, this cell may be made by many known processes since it does not require high voltages for operation and it may be processed to completion without delay since it need not await personalization information from the user. Likewise, it should be noted that both positive and negative pulse sources are not required to write and to erase since a voltage of one polarity can be selectively applied to the first or second control gates to write or erase, respectively, the cell information.

While the invention has been particularly shown and described with reference to preferred embodiments thereof, it will be understood by those skilled in the art that various changes in form and details may be made therein without departing from the spirit and scope of the invention.

What is claimed is:

1. A system comprising;
   a field effect transistor having a floating gate and first and second control gates,
   a charge injector having a graded band gap or stepped composition region disposed between said first control gate and said floating gate having a given capacitance value,
   a capacitor disposed between said second control gate and said floating gate having a capacitance value substantially greater than said given capacitance value, and
   means for applying control pulses to said control gates for controlling charge on said floating gate.

2. A system comprising;
   a charge trapping layer,
   first and second electrodes,
   a charge injector having a graded band gap or stepped composition region and a given capacitance value disposed between said first electrode and said charge trapping layer,
   a capacitor having a capacitance value substantially larger than said given value disposed between second electrode and said charge trapping layer,
   means for selectively applying voltage pulses to said first and second electrodes for controlling charge in said charge trapping layer, and
   means for detecting the charged condition of said charge trapping layer.

3. A memory system comprising;
   a field effect transistor having a floating gate, first and second control gates and source and drain regions defining a channel region,
   a charge injector system including a silicon rich insulating layer disposed between said first control gate and said floating gate, said charge injector having a given capacitance value,
   a capacitor having a capacitance value substantially larger than said given capacitance value disposed between said second gate and said floating gate,
   means for selectively applying voltage pulses to said control gates for controlling charge on said floating gate, and
   means including said drain, source and channel regions for detecting charge on said floating gate.

4. A switching system comprising;
   a semiconductor substrate,
   first and second electrodes,
   a conductive plate,
   a first thin insulating layer disposed between said conductive plate and said substrate, a second thin insulating layer disposed between said conductive plate and said first electrode forming a capacitor having a given capacitance value, a charge injector system having a graded band gap or stepped composition region disposed between said conductive plate and said second electrode exhibiting a capacitance having a value substantially less than said given capacitance value, and means for selectively applying voltage pulses to said electrodes for controlling charges on said conductive plate.

5. A memory system comprising;
an array having a plurality of cells, each cell including a transistor having first and second control gates, a floating gate and source and drain regions, a charge injector having a graded band gap or stepped composition region and a given capacitance value disposed between said first control gate and said floating gate and a capacitor having a capacitance value substantially greater than said given capacitance value disposed between said second control gate and said floating gate, a word line decoder and driver circuit coupled to the second control gate of each of said transistors, a write/erase line decoder and driver circuit coupled to the first control gate of each of said transistors, and a bit line decoder, precharge and sense amplifier circuit coupled to the source and drain regions of each of said transistors.

6. A system comprising;
a field effect transistor having a floating gate and first and second control gates, a charge injector including a graded or stepped composition region disposed between said first control gate and said floating gate adjacent said first control gate having a given capacitance value, a capacitor disposed between said second control gate and said floating gate having a capacitance value several times that of said given capacitance value, and means for applying control pulses to said control gates for controlling charge on said floating gate.

7. A system comprising;
a charge trapping layer,
first and second electrodes, a charge injector including a graded or stepped composition region having a given capacitance value disposed between said first electrode and said charge trapping layer adjacent said first electrode, a capacitor having a capacitance value several times that of said given capacitance value disposed between said second electrode and said charge trapping layer, means for selectively applying voltage pulses to said first and second electrodes for controlling charge in said charge trapping layer, and means for detecting the charged condition of said charge trapping layer.

8. A system as set forth in claim 1 wherein said capacitor has a capacitance value several times that of said given capacitance value.

9. A system as set forth in claim 6 wherein said injector includes an insulator having graded or stepped composition regions near opposite surfaces thereof.

10. A system as set forth in claim 9 wherein a first of said regions is disposed adjacent to said first control gate and a second of said regions is disposed adjacent to said floating gate.

11. A system as set forth in claim 8 wherein said injector includes a silicon dioxide layer having a graded or stepped composition region adjacent said first control gate.

12. A system as set forth in claim 11 wherein said composition region includes silicon.

13. A system as set forth in claim 10 wherein said first and second regions include silicon.

14. A system as set forth in claim 6 wherein said first and second control gates are disposed on one side of said floating gate.

15. A system as set forth in claim 6 wherein one of said control gates is disposed on one side of said floating gate and the other of said control gates is disposed on the opposite side of said floating gate.

16. A system as set forth in claim 15 wherein one of said control gates is a diffusion region of a semiconductor substrate.

17. A system as set forth in claim 2 wherein said capacitor has a capacitance value several times that of said given capacitance value.

18. A system as set forth in claim 7 wherein said injector includes an insulator having graded or stepped composition regions near opposite surfaces thereof.

19. A system as set forth in claim 18 wherein a first of said regions is disposed adjacent to said first electrode and a second of said regions is disposed adjacent to said charge trapping layer.

20. A system as set forth in claim 19 wherein each of said regions includes silicon.

21. A system as set forth in claim 19 wherein said first and second electrodes are disposed on the same side of said charge trappping layer.

22. A system as set forth in claim 19 wherein one of said first and second electrodes is disposed on one side of said charge trapping layer and the other of said electrodes is disposed on the opposite side of said charge trapping layer.

23. A system as set forth in claim 22 wherein one of said electrodes is a diffused semiconductor region.

24. A memory system as set forth in claim 3 wherein said first and second control gates are disposed on one side of said floating gate.

25. A memory system as set forth in claim 3 wherein one of said control gates is disposed on one side of said floating gate and the other of said control gates is disposed on the other side thereof.

26. A memory system as set forth in claim 25 wherein one of said control gates is made of polysilicon and the other of said control gates is a diffused semiconductor region.

27. A switching system as set forth in claim 4 wherein said graded band gap or stepped composition region of said injector system includes an insulator having spaced apart first and second silicon rich regions, said first region being disposed adjacent to said second electrode and said second region being disposed adjacent said conductive plate.

* * * * *